United States Patent [19]
Wall

[11] Patent Number: 5,929,689
[45] Date of Patent: Jul. 27, 1999

[54] PHOTODETECTOR QUIESCENT CURRENT COMPENSATION METHOD AND APPARATUS

[75] Inventor: Llewellyn E. Wall, Concord, Mass.

[73] Assignee: SensArray Corporation, Burlington, Mass.

[21] Appl. No.: 08/924,609

[22] Filed: Sep. 5, 1997

Related U.S. Application Data

[60] Provisional application No. 60/025,506, Sep. 5, 1996.

[51] Int. Cl.$^6$ ...................................................... G06G 7/12
[52] U.S. Cl. ............................ 327/362; 327/94; 327/336
[58] Field of Search ................................... 327/544, 545, 327/546, 554, 362, 378, 390, 91, 95, 96, 514; 330/85, 110; 250/214 R, 214 LS

[56] References Cited

U.S. PATENT DOCUMENTS

| | | | |
|---|---|---|---|
| 2,843,757 | 7/1958 | St. John | 250/214 |
| 4,227,155 | 10/1980 | Lerma | 330/11 |
| 4,258,719 | 3/1981 | Lewyn | 128/690 |
| 4,341,956 | 7/1982 | Bax | 250/214 |
| 5,061,865 | 10/1991 | Durst | 327/336 |
| 5,296,697 | 3/1994 | Moses | 250/214 R |
| 5,486,690 | 1/1996 | Ake | 250/206.1 |
| 5,561,288 | 10/1996 | Stevens | 250/214 C |
| 5,629,522 | 5/1997 | Martin et al. | 250/338.4 |

OTHER PUBLICATIONS

Graseby Infrared, "Multiplexed Infrared Self Scanning Arrays," (brochure) (C) 1995 Graseby Infrared, 12151 Research Parkway, Orlando, FL 32826.

SensArray Corporation, "Multiplexed Infrared Arrays," Photonics Product Portfolio, Sep. 1995, p. 11.

*Primary Examiner*—My-Trang Nu Ton
*Attorney, Agent, or Firm*—Mark Douma

[57] ABSTRACT

In a photodetector amplifier scheme, the invention compensates for variations in photodetector quiescent current by sampling the amplifier output and subtracting a controllable current from the input to the amplifier. When a chopper or other modulator is used on the optical signal, the samples are taken periodically during the chopping cycle. This sampled signal is processed by a combination of gain and low pass filtering. The result of this processing controls a current source which subtracts a significant fraction of the average quiescent current from the total detector current. In a typical application, the amplifier is of the resettable current integrator type. In this case, the invention makes it possible to use smaller integration capacitors resulting in larger signals than if the quiescent current were not reduced by the operation of the invention. The gain, frequency response, and range of compensated quiescent currents and can be altered by changing timing signals. Implementation is directed toward using components which take up little area when fabricated as an integrated circuit.

19 Claims, 8 Drawing Sheets

PHOTODETECTOR QUIESCENT CURRENT COMPENSATION METHOD AND APPARATUS

RELATED APPLICATIONS

Priority is claimed based on a Provisional Application, Ser. No. 60/025,506, filed on Sep. 5, 1996.

BACKGROUND

1. Technical Field

This invention is in the field of radiant energy sensitive photocell circuits. More particularly, the invention provides a means for automatically compensating for quiescent current produced by a photodetector while amplifying the signal current.

2. Background and Description of the Prior Art

Photodetectors are made using a variety of mechanisms and materials. Chief classes of these are photoemissive devices, such as phototubes and photomultipliers, photoconductive resistors made from, e.g., cadmium sulfide, amorphous silicon, lead salts, etc., photovoltaic devices made from, e.g., silicon, indium arsenide, etc. and phototransistors, usually made from silicon. Photovoltaic devices are unique in that they will produce a signal current without the aid of an external power source (e.g., silicon solar cells). All others require an external bias voltage. As a result, even in the absence of radiation, a so-called dark current will flow. Since some background radiation is always present, the term quiescent current is more accurate but the terms are often used interchangeably. Sometimes it is desirable to measure the background radiation. Herein, the term quiescent current means that caused by sources which are not desired to be measured directly as opposed to signal currents.

The quiescent current for photoemissive and photovoltaic devices is, in general, smaller than for photoconductive devices and also, as a general rule, devices using materials which are sensitive to longer wavelength radiation have higher quiescent currents. In fact, for photoconductors used to detect infrared radiation, the quiescent current is orders of magnitude larger than the usually obtained signal current. Thus, circuits which are suitable for other classes of photocells are usually inadequate for photoconductors. Nonetheless, assuming suitable circuitry, infrared photoconductors such as PbS and PbSe possess several advantages in the detection of infrared radiation. Among these are high sensitivity, room temperature operation, low cost, and ease of fabrication as high density arrays.

Photoconductors produce a signal by a variation in conductance roughly proportional to the intensity of infrared radiation. As mentioned, this conductance change is very small compared to the conductance when no radiation is incident. When a fixed external voltage is applied across the photoconductor the resulting current may be described as having two components, the quiescent current due to the quiescent conductance and the much smaller photo current due to the infrared radiation induced conductance change. Amplifying a small signal current in the presence of a large fixed current is difficult and with photoconductors it is even more so because the quiescent conductance varies with the temperature of the detector and there may be a significant component due to variations in any background radiation. Thus, photoconductors require carefully conceived signal processing techniques to maintain their advantages in a commercially viable system.

For photoconductors, if the optical signal is constant or varies at a slow rate, the most favored method for separating the photo current from the quiescent current is to modulate the optical signal, usually with a mechanical chopper. This modulation translates the information in the optical signal to the chopping frequency. The photo current may then be separated from the quiescent current by some form of high pass filtering, wherein signals at frequencies below the chopping frequency are attenuated while signals at or above the chopping frequency are amplified.

In systems using a small number of detectors, high pass filtering is usually accomplished using discrete capacitors and resistors. A simple well-known basic circuit is illustrated in FIG. 1. The photoconductor is biased with voltages, E+ and E−, through a bias resistor, Rb. The bias voltages may be of any polarity as long as there is a difference between them. When the resistance of the photodetector changes, the voltage at the junction with Rb changes and is transmitted by the coupling capacitor Cc to the amplifier A with input resistance Rin. If Rin is large compared to Rd or Rb, the high pass filter cut on frequency is determined by the inverse of the product of Cc and Rin.

For lead salt detectors, the desirable gain of the amplifier is typically on the order of as much as one million. However, with one or two operational amplifiers, it is easy to achieve such high gains as well as large input resistances. Since lead salt detectors work best with chopping frequencies below about one kilohertz, a high input resistance reduces the need for large value coupling capacitors. Even so, if they were required, in discrete circuits, capacitor size is not a major problem.

However, there are a number of applications such as spectroscopic instruments and imaging devices which require a large numbers of detectors. An emerging standard for low cost infrared spectroscopic instruments is a 128 detector linear array. For scanned imaging systems, 512 or more is preferable and there are applications where two dimensional arrays with thousands of detectors are desired. In these applications, integrated circuits with a large number of detector amplifier channels per chip are preferred. However, operational amplifiers and large value capacitors would take up too much chip area. A typical instrumentation op amp might be 0.01 sq. in. and 32 channels of these would require 0.32 sq. in. for these alone. This is too large to be economical enough for most applications. Thus, different approaches are required.

Referring back to FIG. 1, one possibility is to make the bias voltages equal and opposite and the bias resistor the same value as the quiescent resistance of the photodetector. In this case, the DC voltage at the junction is zero and the coupling capacitor can be eliminated. However, this is not a workable solution. As noted, the amplifier gain is so large that, in practice, changes in photodetector resistance due to temperature changes or background radiation quickly unbalance the circuit so the output of the amplifier saturates. For lead salt detectors, the temperature coefficient of resisitance is about −2%/°C. so that small temperature changes are troublesome. Using a bridge circuit with a matched photodetector and a differential amplifier is a well-known improvement. Unfortunately, this reduces the signal to noise and roughly doubles the number of components.

One step known in the prior art which has been taken toward solving the problem of providing amplifier gain using small amounts of chip area is to integrate the current from the photodetector as illustrated in FIG. 2. In this circuit, the MOSFET transistor Q serves as an impedance transformer where the resistance presented to the detector is low (hundreds of kΩ) relative to the resistance presented to the capacitor Ci (thousands of MΩ). Also, if the amplifier a has a MOSFET input, Rin will be large enough to be ignored. Thus, Ci is fed by a current source with value $I_{net}=I_{det}-I_b$. In operation, the switch, S, is closed until the integrating capacitor is discharged (reset) and then opened under the control of RST. The voltage on Ci is simply $V_i=(1/Ci)\int I_{net}(t)$ dt. For the purposes of illustration, assume that $I_{net}$ is constant so that $V_i=I_{net}\times T_i/Ci$. With typical values of integration time $T_i=1$ ms and Ci=10 pf (which takes up little chip area), $T_i/Ci=100$ MΩ. In the circuit of FIG. 1, with typical values of Rdet=Rb=10 MΩ, the parallel resistance $R_p=5$ MΩ so that a relative voltage gain of 20 is obtained by the circuit of FIG. 2. Higher gains can be obtained by reducing Ci or increasing $T_i$.

An initial gain of 20 or more is enough to overcome the effects of any noise that might be introduced by later signal processing. In particular, the amplifier following Ci can be a simple buffer and it becomes possible to delay further amplification until the multiple signals have been sampled and held, passed through a multiplexor, and all channels amplified in sequence by a single additional amplifier residing off the chip.

Unfortunately, the drawback to using a reset current integrator is that it amplifies the, often much larger, DC quiescent current as well and can result in saturation of the following amplifier. Besides chip area, selecting a value for Ci always results in a tradeoff between having enough signal gain and avoiding saturation. For each application, the signal frequency will determine $T_i$ and the detector characteristics will determine the net DC current $I_{net}$ into Ci. For detectors with large quiescent currents, to avoid saturation, the bias current $I_b$ must still be matched to the quiescent current $I_{det}$ with a precision which is roughly better than the inverse of the gain (5% in the example). As noted above, this is hard to accomplish and/or maintain as ambient conditions change, especially for a large number of channels. An attempt to solve this problem for lead salt detectors, hopefully allowing for use without any intentional chopping, which is commercially available is believed to be illustrated in FIG. 3.

This differs from the previous prior art example in that, instead of a fixed bias resistor acting as a balancing current sink, MOSFET transistor M3 in conjunction with an on-chip digital-to-analog convertor D/A act as a variable current sink. Transistors M1 and M2 are voltage level translators, but have no intentional effect on the currents charging the integration capacitor CW. The amount of current required from the D/A is determined by a calibration step in which the detectors are exposed to a DC radiation source, the detector current is integrated by CW, sampled and held by S/H, and converted to a digital value by the off-chip analog-to-digital convertor A/D CONVERTOR. Off-chip DIGITAL PROCESSING then calculates a digital value which is sent to the on-chip digital STORAGE REGISTER which drives the D/A.

This approach works under some conditions but has several disadvantages. The major one is that the temperature coefficient of resistance of the photodetectors is so large that the quiescent current will drift large amounts even with reasonable temperature control. Thus, signal measurements must be interrupted and the calibration step preformed from time to time. Even so, temperature controllers are expensive, bulky, and consume many times the power of an integrated circuit. Second, every photodetector must have its own associated on-chip digital-to-analog convertor. This requires a large amount of chip area unless the resolution of the convertor is very low. If the resolution is low, then it will be difficult to match the photodetector quiescent current and, therefore, the gain at the integration capacitor must be reduced to avoid saturation. Lastly, in some situations it may not be convenient or cost effective to require an external analog-to-digital converter and digital processor.

SUMMARY

Accordingly, an object of the present invention is to suppress the effects of variations in the quiescent current of a photodetector with precision and minimal delay while providing a high gain for signal currents. A further object is to use electronic components which are both small in number and would require small amounts of integrated circuit chip area. Still further objects are to provide such suppression on the fly without interrupting normal operation nor requiring significant apparatus external to the integrated circuit. Although the need is greatest for photoconductors, the object of the invention is not limited to them and may be used with other classes of detectors. Another object of the invention is to provide the capability of changing the average output signal and time constant of the quiescent current suppression by means external to the circuit. All of these and additional benefits are described below.

In a photodetector amplifier scheme, the invention compensates for variations in photodetector quiescent current by sampling the amplifier output and subtracting a controllable current from the input to the amplifier. When a chopper or other modulator is used on the optical signal, the samples are taken periodically during the chopping cycle. This sampled signal is processed by a combination of gain and low pass filtering. The result of this processing controls a current source which subtracts a significant fraction of the average quiescent current from the total detector current. In a typical application, the amplifier is of the resettable current integrator type. In this case, the invention makes it possible to use smaller integration capacitors resulting in larger signals than if the quiescent current were not reduced by the operation of the invention. Larger voltage signals are desirable because the noise and drift of succeeding stages are relatively less significant. In addition to the suppression of quiescent current, the circuit provides other beneficial features. Among these features are: simplicity and small size permitting economical incorporation into an integrated circuit, the ability to modify the frequency response and gain of the circuit by adjustment of timing signals generated external to the circuit, operation in at least the two modes most commonly used in the processing of photoconductor signals, and suitability for fabrication as a CMOS integrated circuit without any special manufacturing techniques.

DETAILED DESCRIPTION OF THE INVENTION

1. Description of a Typical Embodiment

Figure 2:
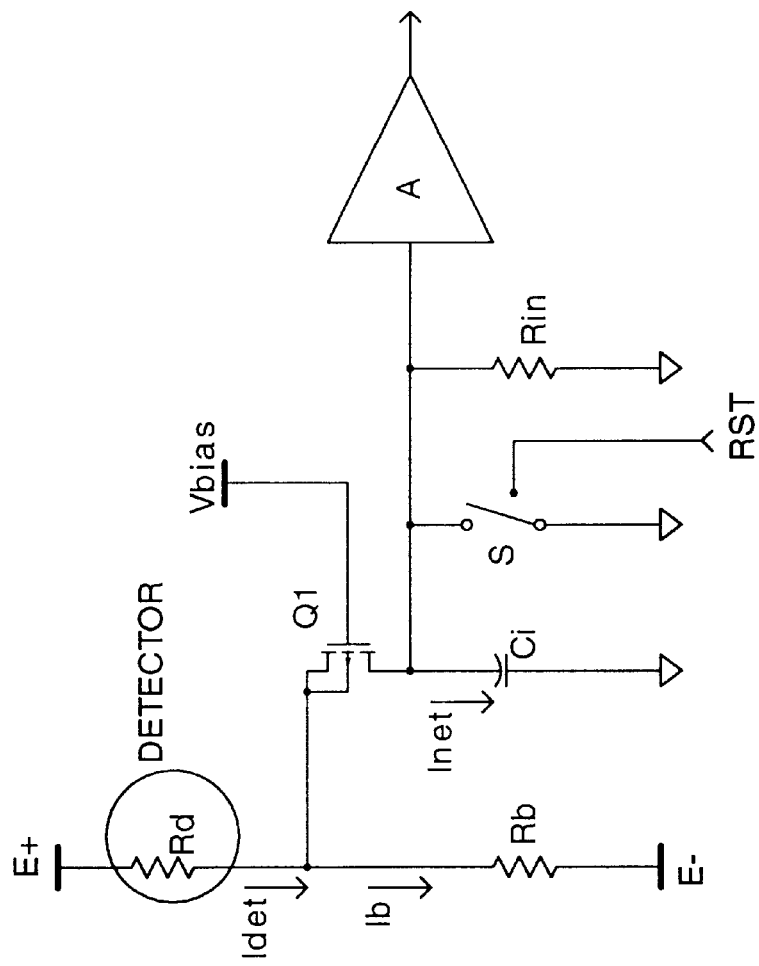
FIG. 2 is a schematic of reset type integrating amplifier.
Figure 1:
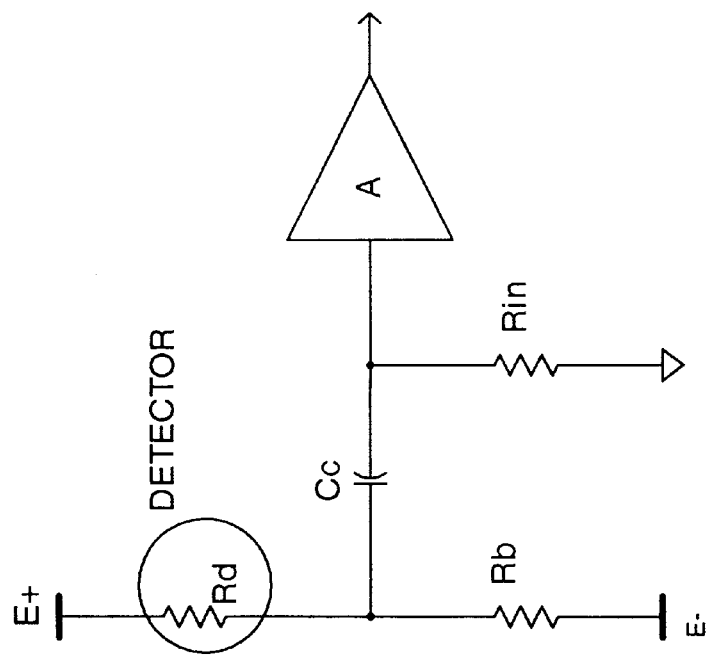
FIG. 1 is a schematic of a basic photoconductor front end.
Figure 3:
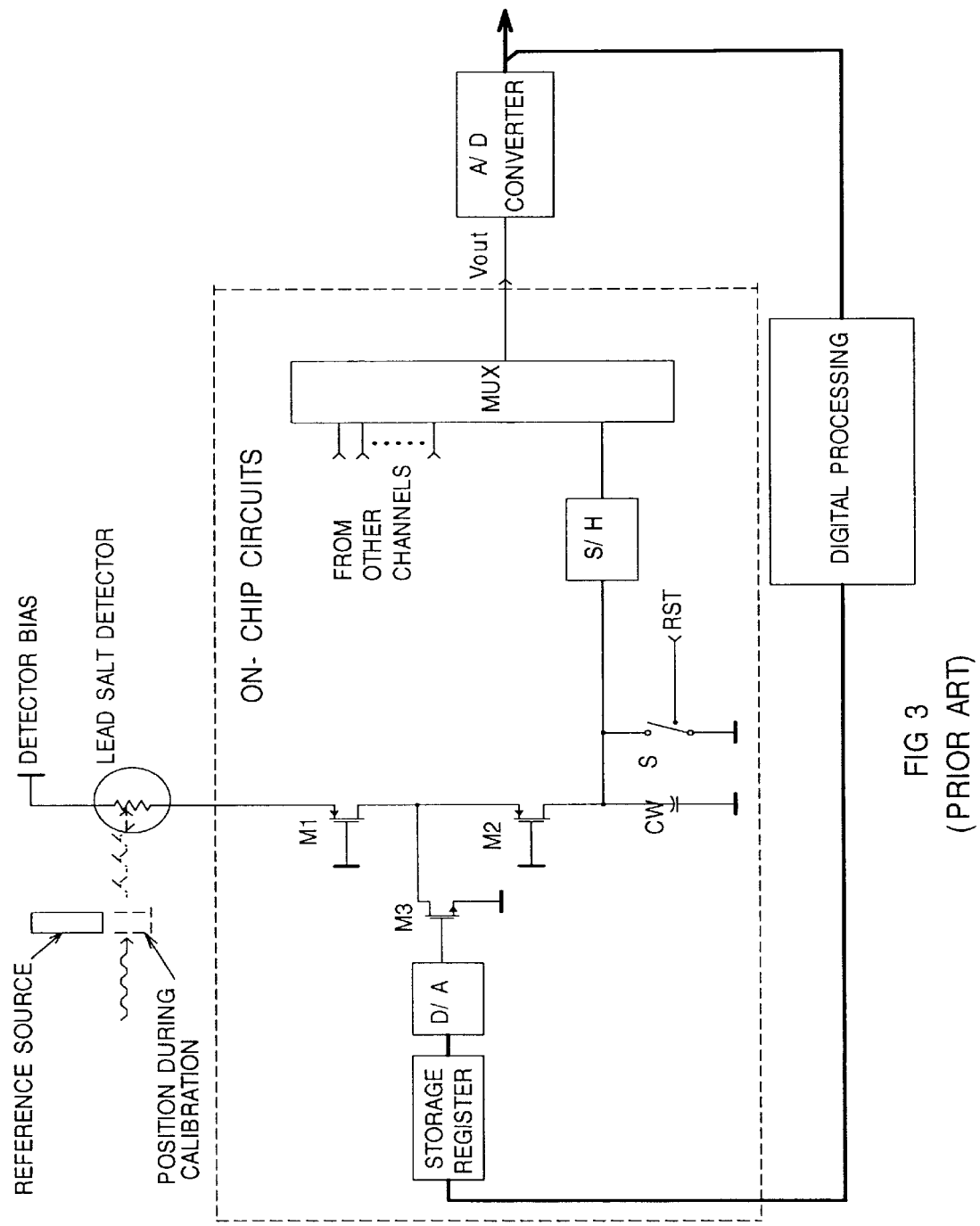
FIG. 3 is a schematic of a commercially available quiescent current suppression scheme.
Figure 4:
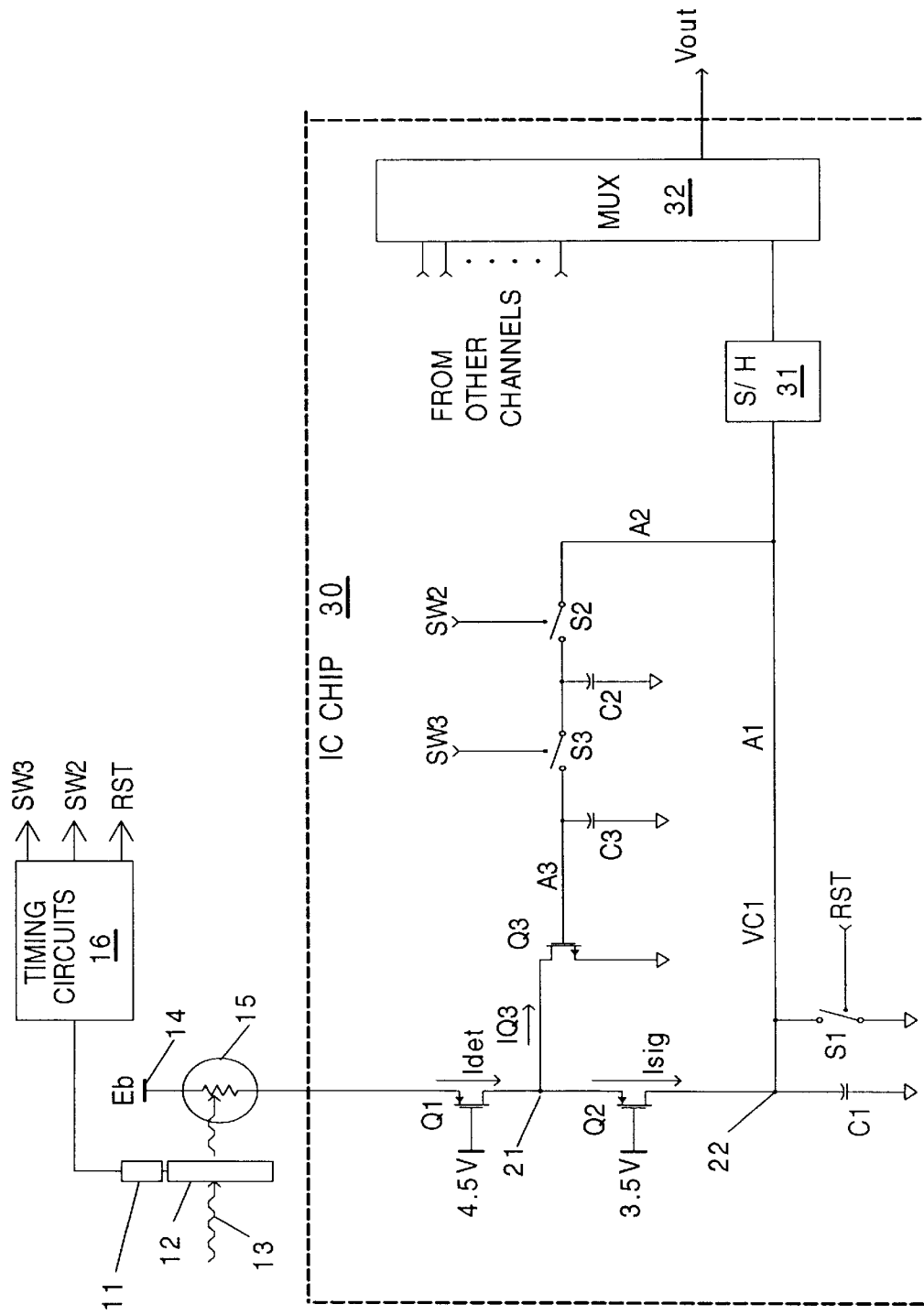
FIG. 4 is a schematic diagram of a typical embodiment of the invention.

The invention may be made in a number of ways and used in a number of applications. However, it can be understood most readily by reference to an embodiment utilized in a typical application as illustrated in FIG. 4. In this version, the invention is employed with an integrated circuit chip 30 which is capable of servicing a large number of detector channels (here, 32). The chip contains signal processing known in the prior art and additional circuitry. Off the chip is illustrated one of the number of detectors 15 receiving a modulated optical signal and circuitry for generating timing signals required by the on-chip circuitry.

In a typical application, an optical modulator 12, for example a mechanical chopper, is used. The optical signal 13 is made to pass through it before impinging on a photodetector 15 which, for illustration, is a photoconductive type. The topmost waveform in FIG. 5, Chopped Detector Signal, illustrates the optical radiation intensity on the detector. There are two regions identified. Chopper Closed indicates a period of time when the optical modulator is blocking the optical signal from reaching the detector. This time period may also be thought of as a reference period because during this time the detector is viewing the chopper blades or some other optical reference surface which remains at a fixed optical intensity. The other region identified as Chopper Open is a period of time when the optical signal (shown much exaggerated) is allowed to pass completely through the modulator and reach the detector. In between, the modulator is in the process of making a transition between open or closed and the optical signal is rising or falling. Typically, this period is shorter than the relatively long times shown for illustration.

Also, usually, as shown in FIG. 4, it will be possible to employ a modulator pickup 11 which by optical, mechanical, or other means senses and outputs a synchronizing signal indicating the state of the modulator, open or closed. Timing circuits 16 receive the pickup output and generate signals RST, SW2, and SW3 whose function will be explained. The timing circuits can be easily made with simple digital logic circuits and so construction details will not be set out.

FIG. 4 illustrates only one of the identical detector/electronics channels. A multiplexor 32 sequentially accesses the signals from all of them and makes these available at the chip output. The input signal to one channel is a current $I_{det}$ flowing through its associated detector 15 which is caused by the voltage Eb at 14. This voltage must be larger than the chip power supply voltage but is typically ten or more volts versus six volts for the chip. The $I_{det}$ current flows through a common gate connected MOSFET Q1 the drain of which is connected to a current node 21. At the current node, $I_{det}$ is divided into two components, $I_{Q3}$ and $I_{sig}$. $I_{Q3}$ is a current which is determined by the gate-to-source voltage on common source connected MOSFET Q3 which is in turn determined by the remainder of the circuitry. $I_{sig}$ is that portion of $I_{det}$ left after subtraction of the $I_{Q3}$ current, i.e., $I_{sig}=I_{det}-I_{Q3}$. $I_{sig}$ flows through the common gate connected MOSFET Q3 and into the node at 22.

Neither Q1 nor Q2 are required for the invention to work. However, they are desirable in a typical application because, as is well known, they isolate the source side of the circuit from voltage variations on the drain side. The voltage bias on the gate of Q1 should be as high as possible but cannot be higher than one threshold voltage, $V_{TH}$, (about one volt for silicon CMOS) below the chip power supply, 5 volts for a 6-volt supply. The voltage bias on the gate of Q2 cannot be higher than about one threshold below the bias at Q1, about 4 volts. The maximum of the voltage $V_{C1}$ at 22 on C1 before Q2 would saturate $V_{sat}$ is three threshold drops below the chip power supply. This is only about 3 volts, but this is not a major limitation if $I_{Q3}$ subtracts the large quiescent current from $I_{det}$. Even if Q1 and Q2 are not used, a high enough voltage, e.g., about 6 volts, on C1 would saturate some other circuitry connected to it. (When the voltage on C1 is limited to 3 volts, the point A1 in the figure indicates where an additional amplifier with a gain approaching 2 could be inserted to boost the signal to a maximum approaching 6 volts.)

The integration of the signal $I_{sig}$ by C1 proceeds as follows. During the transition period, RST is made positive enough to turn on the MOSFET switch S1 and clamp C1 to a ground reference level. When the chopper is open or closed, RST is made low enough to turn off S1 and C1 is charged by $I_{sig}$ for the time $T_r$ as shown by the waveform $V_{C1}$ in FIG. 5. The sample and hold 31 samples $V_{C1}$ at the end of the integration periods and holds the value for later signal processing such as multiplexing as shown in FIG. 4.

Figure 5:
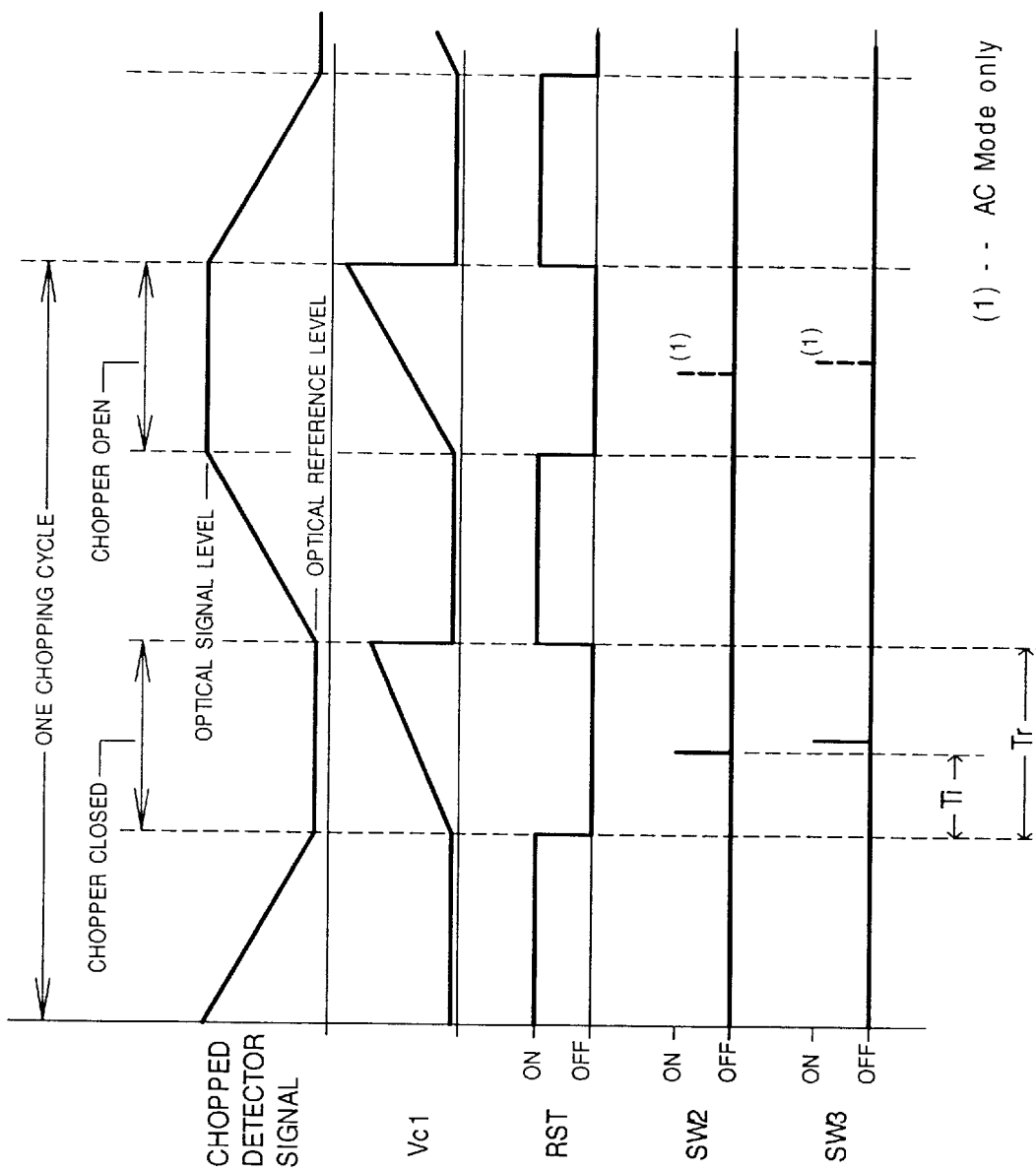
FIG. 5 is a timing diagram showing signals at various points in the circuit as a function of time.

FIG. 5 illustrates $V_{C1}$ as ramps which indicates that $I_{sig}$ was essentially constant and there was a small difference between Chopper Open and Chopper Closed. For a photoconductor, as noted in the background discussion, by far the largest component of the current is the quiescent current which varies slowly over a chopper period. In fact for a typical photoconductor with a resistance of 10 MΩ, a detector bias of Eb=10 volts and using a chopping frequency of 500 Hz so that $T_r$=1 ms, $V_{C1}$ would attempt to rise to 100 volts and would certainly saturate some device in the circuit. This can be prevented by increasing C1 if space permits, but this results in less signal gain. The alternative is to use the circuitry to subtract so much of the quiescent current that $V_{C1}$ never rises above a few volts.

Quiescent current compensation signal processing proceeds by also taking a sample of $V_{C1}$. However, as shown in the curve labeled S2 in FIG. 5, it need not occur at the end of the integration periods $T_r$ but may occur at a shorter time $T_i$. At this time, signal SW2 turns on S2 momentarily to take a sample of $V_{C1}$. A short time later, as shown by curve SW3, S3 turns on momentarily to take a sample of the voltage on C2 which is transferred to C3. As is well known, the size of C2 should be small compared to the size of C1 in order to avoid transferring much of the charge on C1 to C2. If not, the value of $V_{C1}$ seen by the later sample and hold 31 and further processed will be reduced. Alternately, the point A2 indicates where a buffer amplifier could be inserted so that C1 is not discharged by C2.

C3, on the other hand, is preferably larger than C2. This sampling with the combination S2, C2, S3, C3 is well known in the art to be equivalent to an R-C low pass filter where S2, C2, and S3 form a switched-capacitor resistor and C3 is the filter capacitor. The equivalent resistance is given simply by $$Req=T_a/C2$$

where $T_a$ is the average time between samples. The RC time constant, $T_c$, is therefore $$T_c=(C3/C2)T_a$$

If, for example, C3/C2=300 and since, here, $T_a$ is one chopper cycle, then the circuit averages $V_{C1}$ over 300 chopper cycles.

The voltage on C3 is connected to the gate of common source connected MOSFET Q3. When this voltage rises above the threshold voltage, $V_{TH}$, of Q3, it turns on and the current $I_{Q3}$ is subtracted from $I_{det}$ at the node. The circuit creates a feedback loop which, to the extent that the transconductance $G_m$ of Q3 is large, forces $V_{C1}$ at the time $T_i$ to be slightly above the threshold voltage of Q3, i.e., $V_{C1}(T_i) \cong V_{TH}$. (Point A3 indicates another point where an amplifier could be inserted to, in this case, increase the gain either alone or in conjunction with current source linearizing circuitry.)

The waveforms SW2 and SW3 in FIG. 5 illustrate two sampling modes which emulate the two most common photoconductor signal processing techniques. In a DC Restore mode, samples are taken only during the Chopper Closed period. In this mode the circuitry will keep $V_{C1}(T_i)$ during the Chopper Closed period at a level representing the Optical Reference Level. In an AC Mode, a sample is taken at the same time $T_i$ in both the Chopper Open and Chopper Closed periods. In this mode, the circuitry will keep $V_{C1}$ at a level representing the average of the Optical Reference Level and the Optical Signal Level. The resultant signal $V_{out}$ is effectively AC coupled, swinging equally around a fixed level. The DC Restore is useful if, during the Chopper Closed period, a stable optical reference signal impinges on the detector. If so, then the off-chip electronics may be able to ignore the Chopper Closed and simply display the Chopper Open results without taking any differences. The AC Mode is more useful when either the signal during the Chopper Open period is large compared to the quiescent current and it is necessary to keep this ramp from saturating or the Chopper Closed reference radiation is not stable.

Additional flexibility may be obtained by adjusting the position of the samples within the periods. In the DC Mode, for instance, if $T_i$ is delayed until the end of the period, then the Chopper Open ramp is minimized allowing the largest positive values for $I_{sig}$. If $T_i$ occurs sooner, the values for Isig can be pushed more and more negative (see below). This ability to adjust the level of the output signal by simple external time delays increases the utility of the circuit by allowing the user to set the level at a value most suitable to their application.

Moreover, sampling is not limited to once per period. One can skip periods or sample many times within a period, even at irregular intervals. The result would produce a voltage on Q3 which is the average of all these samples. For example, if high frequency noise were present to such an extent that integration by C1 did not reduce it adequately, one could sample many times in a period.

If no synchronizing signal is available to determine RST, then typically it and the circuitry would be operated at some fixed frequency designed to capture optical signals which might be present. However, the circuit doesn't require an optical signal to operate. In all cases, it simply forces the average $V_{C1}(T_i)$ toward the $V_{TH}$ of Q3.

2. Linear Model of the Circuitry

Figure 6:
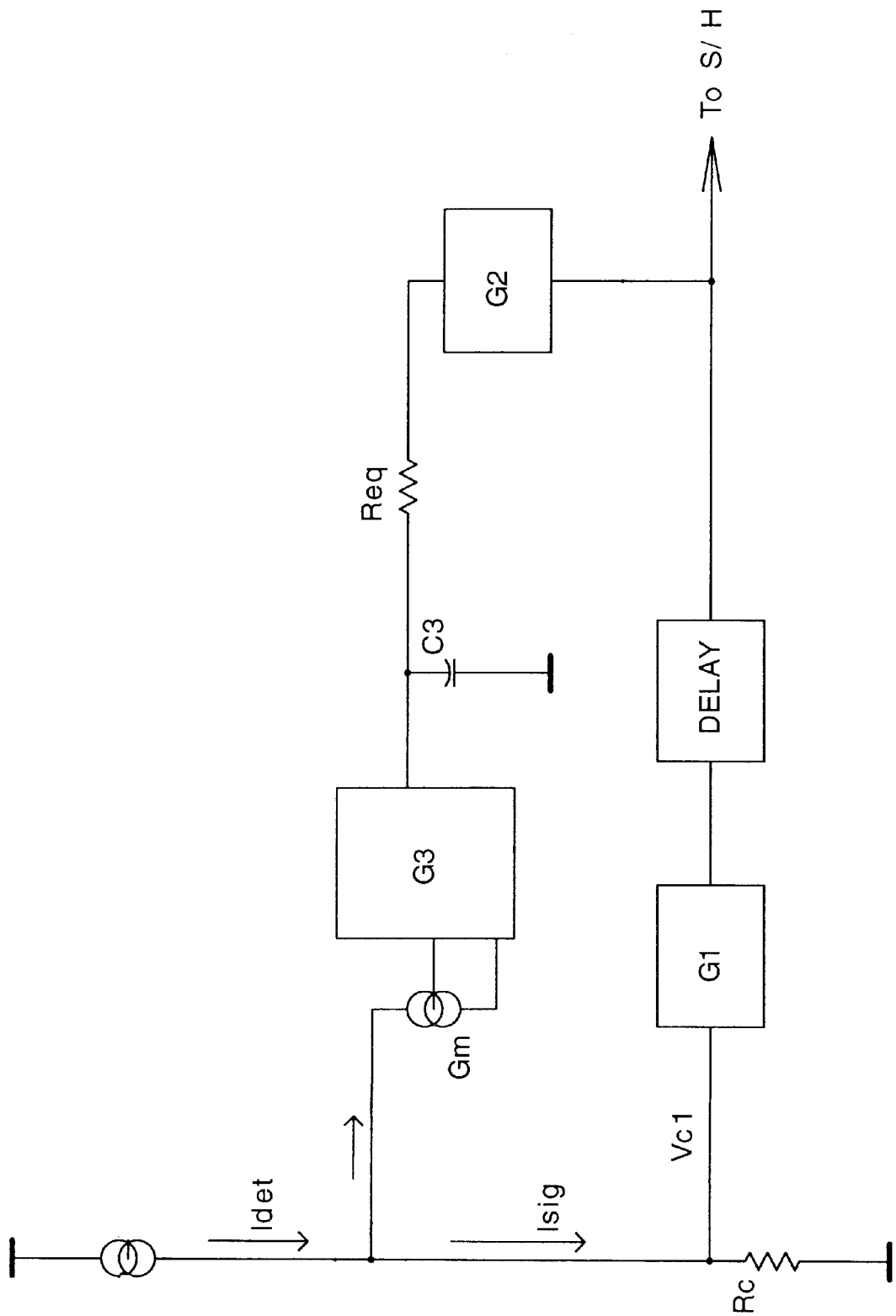
FIG. 6 is a schematic diagram of a linear model.

The gain and frequency response of the circuit can be understood by analyzing a linear model as illustrated in FIG. 6. The following substitutions are made for the elements in FIG. 4.

Q1 and the detector 15 are replaced by an ideal current source, $I_{det}$.

Q3 is replaced by an ideal controllable current source with transconductance=$G_m$.

Q2 is not needed because $I_{det}$ and $I_{Q3}$ are ideal current sources.

C1 and S1 are replaced by resistor Rc, where $Rc=T_i/C1$.

S2, C2, and S3 are replaced by $Req=T_a/C2$.

If A1, A2, or A3 are used, they replaced by pure gains G1, G2, and G3.

For this linear model, the amplifier and MOSFET offsets and the delay are set to zero. The circuit equations for the linear model yield:

$$\frac{V_{C1}}{I_{det}}(s) = R_c \frac{sT_c + 1}{sT_c + (1 + G_1 G_2 G_3 G_m R_c)}$$

where $T_c = ReqC3 = (C3/C2)T_a$ and s=the complex frequency, $j\omega+\sigma$. Using typical values from above:

C1=10 pf., C2=0.1 pf., C3=30 pf.

G1=G2=G3=1

$T_i$=0.5 mS for a Chopping Cycle Time=2 ms

Gm=2 $\mu$S so that

Rc=50 M$\Omega$ and $T_c$=300 $T_a$

The value of $G_m$ has not been discussed because it requires special consideration. Usually, $G_m$ would be selected to be as high as possible to the point where the circuit becomes unstable. However, for use with photodetectors, it must be high enough for the circuit to have enough gain, but not too high. The current noise from a MOSFET which, in the case of Q3, feeds directly into the signal path, is proportional to the square root of $G_m$. As a compromise, a MOSFET with an unusually low $G_m$, on the order of a $\mu$S, is preferable for this typical application. In other cases, $G_m$ should be selected so that the noise from Q3 is preferably less than the noise from the detector. It should be noted that for all FETs, $G_m$ is not constant but varies linearly with drain currents at low values and as the square root at higher ones. Thus, the required Gm is a function of the expected quiescent current to be compensated by Q3. The circuit may be stable at low $I_{Q3}$ but unstable at higher ones. Fortunately, as the working example below shows, a broad range of $I_{Q3}$ can be accommodated.

Figure 7:
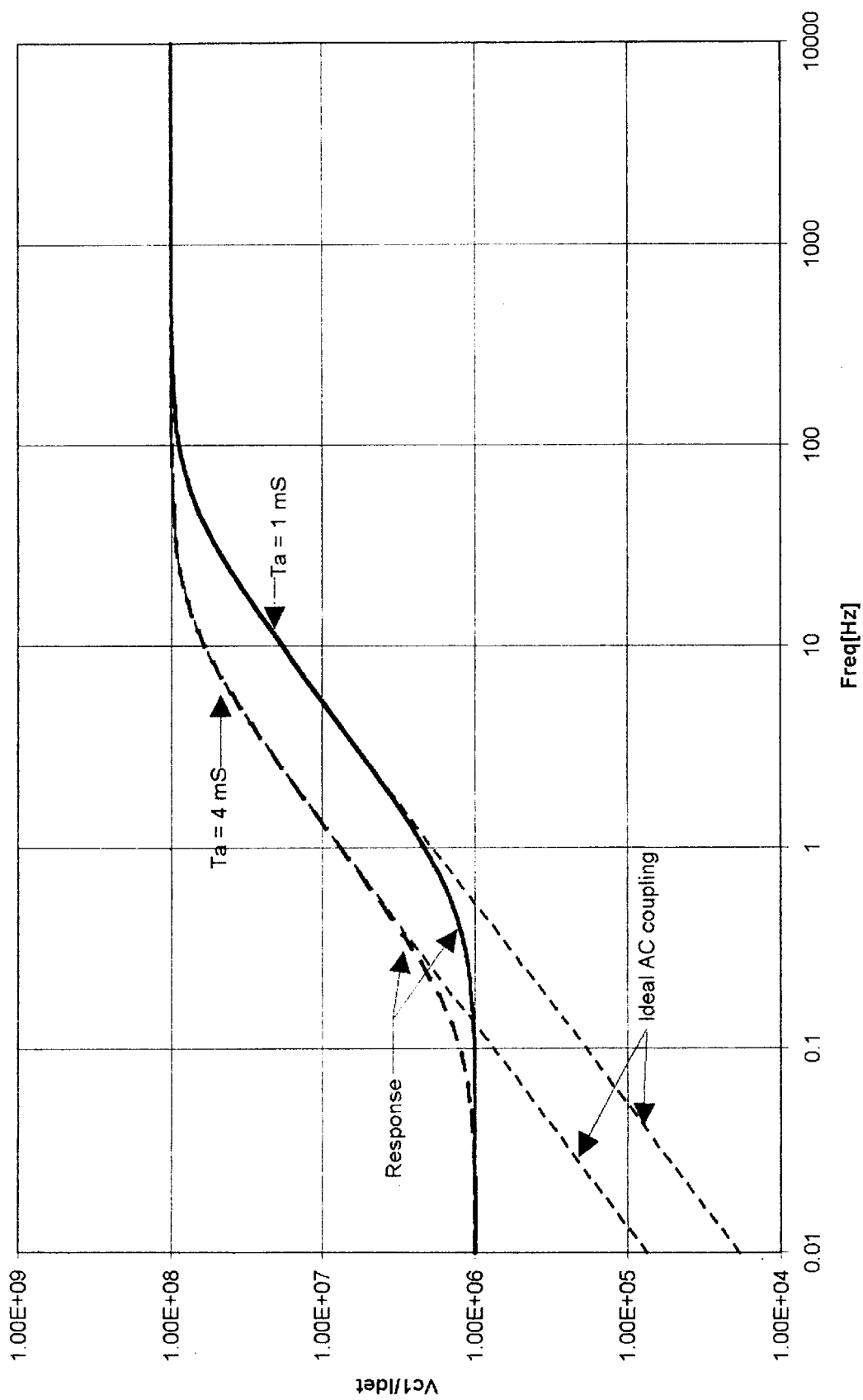
FIG. 7 is a frequency response plot of the circuit based on the linear model.

FIG. 7 shows a plot of the gain versus frequency response for two values of $T_a$. With $T_a$=1 ms, the signal is sampled twice per cycle and with $T_a$=4 ms, once every other cycle. The curves for the two cases of $T_a$ show the ability to adjust the overall circuit frequency response by external timing means.

The gain ($V_{C1}/I_{det}$) at high frequencies (>100 Hz) is set by $R_c$, here $0.5 \times 10^8$, or 100 times the gain at low frequencies (<0.1 Hz) set by $1/(G1G2G3G_m)$. The dotted lines show Ideal AC Coupling, as would be obtained with an AC coupling capacitor, in which the gain approaches zero as the frequency approaches zero. This could be approached with this invention by adding amplifiers with gain at the points previously indicated. Even so, while the low frequency gain of the circuit does not approach zero, it is small enough to accommodate variations in quiescent resistance typically found in photoconductive arrays. For instance, if the bias current were 1 $\mu$A, a typical value, and the quiescent resistance were to drift 10%, the output of the circuit would change only 0.05 volts. (10% of 1 uA=0.1 $\mu$A, and 0.1 $\mu$A$\times 0.5\times 10^6$=0.05 V). If, on the other hand, the 500 Hz modulated photocurrent, were to change the same 0.1 $\mu$A, the output would change 5V (0.1 $\mu$A$\times 0.5\times 10^8$=5). Thus, the circuit fulfills its purpose of reducing the effects of slow quiescent current variations while maintaining high gain at the chopping frequency.

As noted, to reduce noise, $G_m$ should be low but if it is, then $V_{C1}(T_i)$ will have to be above $V_{TH}$ in order to produce a large enough $I_{Q3}$. However, as long as $V_{C1}(T_i)$ is less than $V_{sat}$, signals can be integrated. The maximum range of $I_{sig}$, assuming a constant signal, is $C1V_{sat}/T_r$. If $G_m$ were very large, then $I_{sig}$ would range from $-C1V_{TH}/T_r$ to $+C1(V_{sat}-V_{TH})/T_r$. As $G_m$ is reduced, the range would shift more negative. Another way to cause a negative shift in range is to sample at less than the full Chopper Off period. In this case, $V_{C1}(T_i)$ approaches $V_{th}$ but $V_{C1}(T_r)$ will be larger and, if $T_i$ is small enough, reach $V_{sat}$ before the end of the Chopper Off period. However, if $I_{sig}$ is negative enough during the Chopper On period, it will cause the voltage on C1 to remain below $V_{sat}$. This mode of operation is useful if the radiation on the detector when the chopper is on is less than when the chopper is off. This would occur, for example, when viewing the upper atmosphere or the night sky from a heated airplane. For use in such conditions, those skilled in the art could easily construct circuits to monitor the output of one or more channels and on detecting zero or saturated signals, vary $T_i$ to find an optimum setting for it. Of course, an intentionally hot choper could be used and compensated in all situations. It should be noted that this mode cannot be obtained if feedback were perfect in the sense of infinite $G_m$ and zero $V_{TH}$.

3. Loop Stability

Since the circuit is a closed loop system, the issue of loop stability needs consideration. In general, a feedback loop will be unstable if the phase lag exceeds 180 degrees while the magnitude of the open loop gain is greater than unity. In the analysis of the linear model frequency response, the delay due to sampling was assumed to be zero. In that case, the loop will be stable for all conditions because the maximum phase lag is limited to the 90 degree contribution from the $R_{eq}C^3$ time constant.

In a system that uses periodic sampling with a time between samples of $T_d$, the phase lag in degrees as a function of frequency f is $360 \times T_d \times f$. (This is a close but adequate approximation in the case of the reset integrator C1-S1 used in the invention.)

In terms of times and capacitor values, the total phase lag becomes $$\Phi = \tan^{-1}(2\pi fT_a(C_3/C_2)) + 2\pi fT_d$$

and the magnitude of the gain is $$M = \frac{T_i G_m / C_1}{\sqrt{1 + (2\pi fT_a(C_3/C_2))^2}}$$

where, as before, $T_i$ is the time delay into the reset integration before a sample is taken. The times $T_a$, $T_d$, and $T_i$ can all be independently varied so that a complete discussion is tedious. However, a simple case is presented by the DC Mode which also turns out to be a worst case in terms of stability. In this mode, even though the reset integrator is run twice per cycle, a sample is taken only once every full chopping cycle so that $T_a = T_d = 1/F_{chop}$ where $F_{chop}$ is the chopping frequency. The case is made still simpler and worse (because the gain is increased) if the chopper is assumed to be ideal with no transition period and the sample is taken at the end of the Chopper Closed period so that $T_i = 2/F_{chop}$. $F_{chop}$ now becomes a single parameter characterizing the loop.

Figure 8:
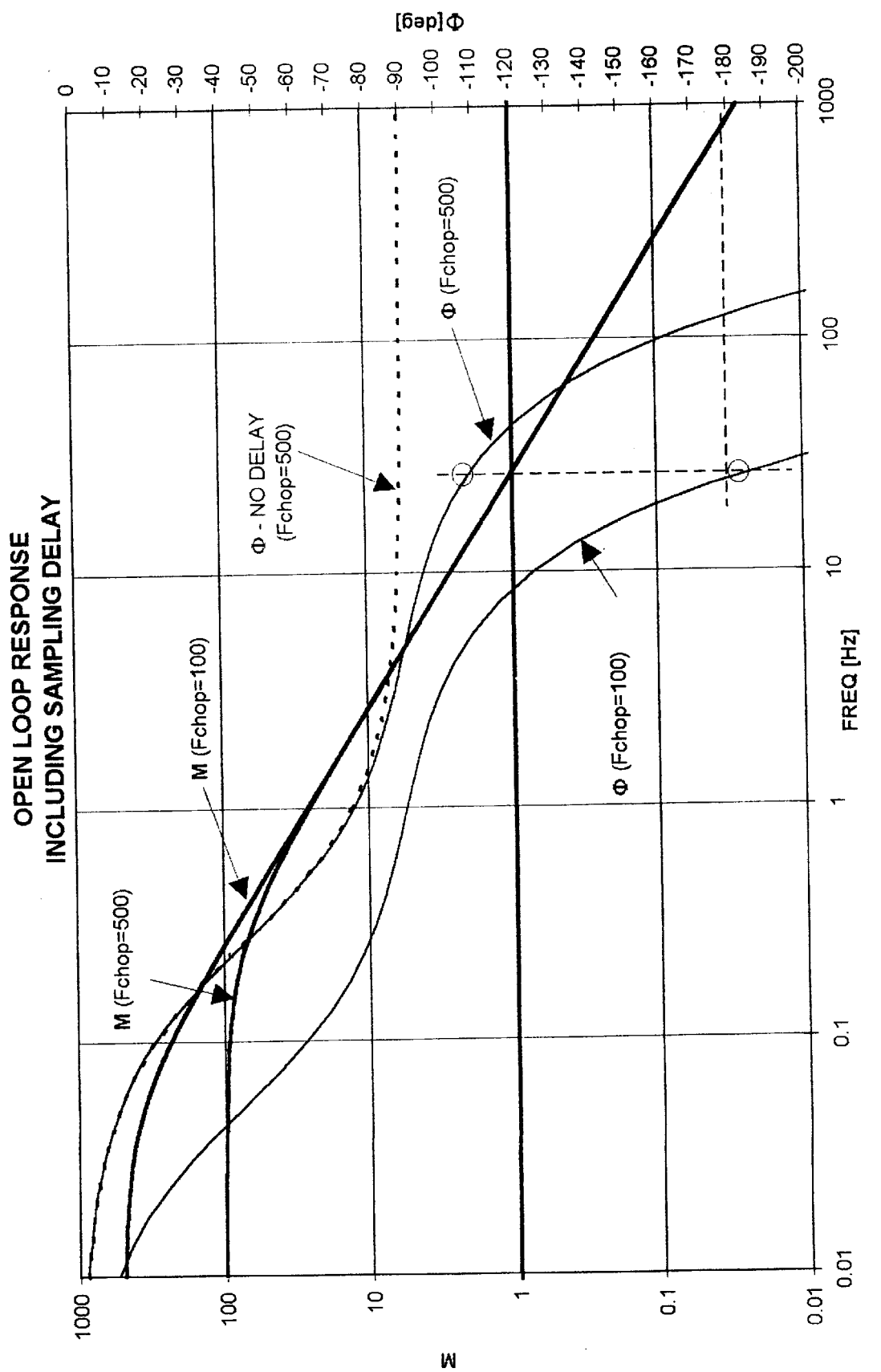
FIG. 8 is an open loop gain-phase plot that includes the effects of sampling delay.

$\Phi$ and M are shown in FIG. 8 as a function of frequency f for two different chopper frequencies, $F_{chop}=100$ and 500 Hz. While the gain magnitude at DC for a 100 Hz chopper is higher than for the 500 Hz chopper by a factor of five because $T_i$ is five times larger, by about one Hz the gains are the same and dominated by the low pass filter. However, the phase lags differ. For the 500 Hz chopper, the phase lag when the magnitude crosses unity is about 107 degrees so that there is a stability margin of about 73 degrees. On the other hand, the 100 Hz chopper shows a phase lag slightly greater than 180 degrees, which means that the loop would be unstable. (A limit cycle analysis shows that the oscillation frequency is close to $F_{chop}/2$ and not the 26 Hz suggested in the figure.)

This seems to indicate that quiescent current compensation employing the circuit component values, i.e., capacitor and $G_m$ values, cannot be used with a 100 Hz or slower chopper. However, the value for $T_d$ can be decreased. First, the AC Mode (sampling twice per cycle) could be used which would cut $T_d$ and $T_a$ in half ($T_i$ can remain unchanged) as well as the lowest stable $F_{chop}$. Further, by over sampling, all three, $T_d$, $T_a$, and $T_i$ can be reduced. A reduction in $T_i$ means that the gain magnitude is also reduced which provides even more phase margin.

Of course, stability without gain is not useful. It could be regained if C1 is decreased but this requires a new chip or one with selectable capacitors. Decreasing C1 may also require a buffer amplifier at A2 in order not to load it with C2. C2 is already too small to be satisfactorily reduced further. If C2 is changed, C3 should be changed proportionately to maintain the same ratio which seems to be optimum from a noise and stability standpoint.

Although, for many detectors and systems, chopping frequencies between about 100 Hz and 1 Khz are preferred, higher ones can be accommodated if C1 is reduced. A lower practical limit is about 0.1 pf., 100 times smaller than the 10 pf used in the example, with the same considerations on C2 just noted. The CMOS circuitry can easily run above the 50 kHz level that this implies. At the other extreme, the circuitry can be operated without any chopper or signal modulation. Its primary purpose is to subtract the quiescent current for which it only needs a sample often enough to be stable.

4. Working Example

Figure 9:
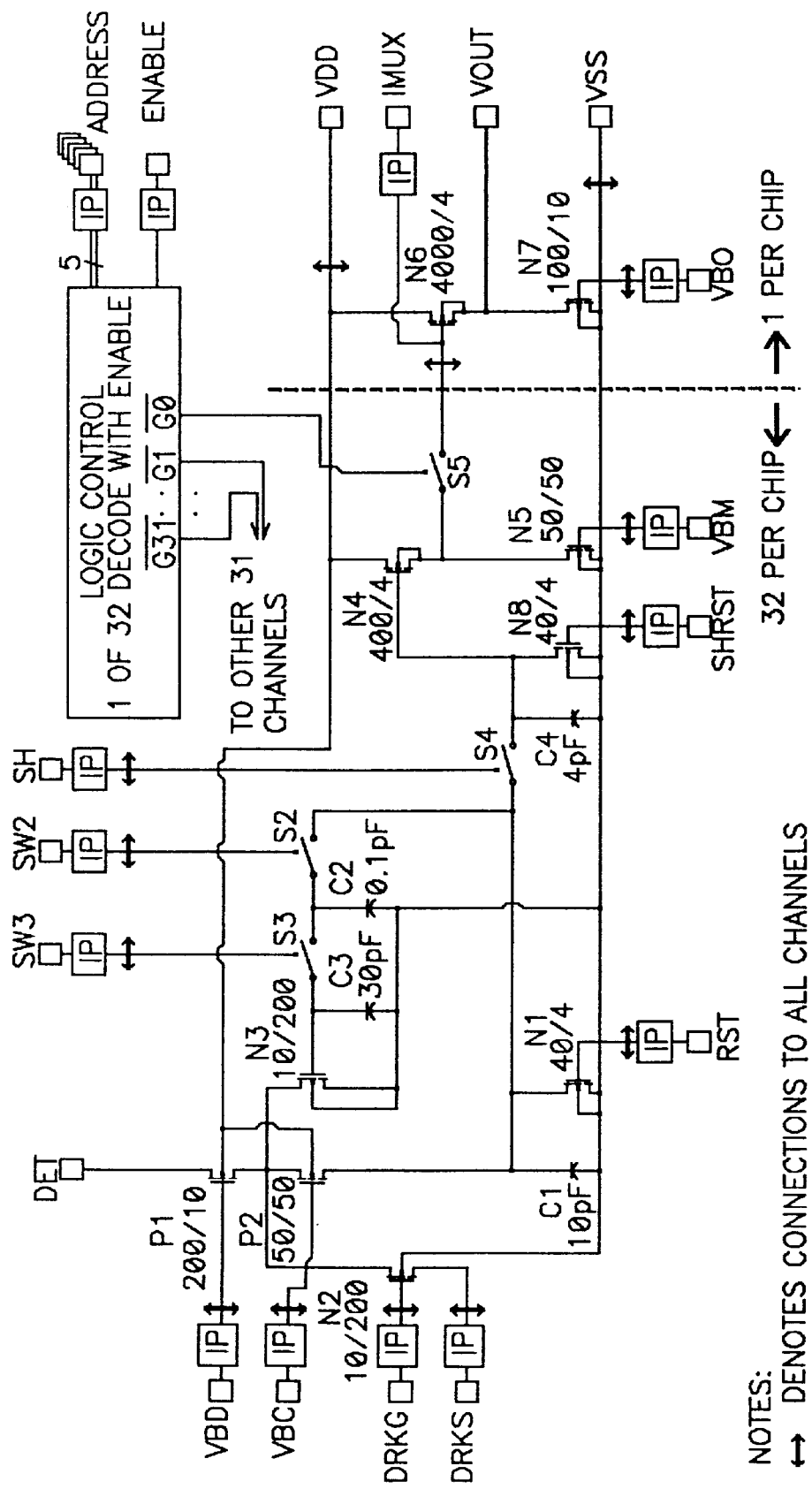
FIG. 9 is a schematic diagram used to manufacture an integrated circuit with 32 channels.

An integrated circuit that could handle 32 detectors was constructed based on the schematic shown in FIG. 9. Those skilled in the silicon foundry art were able to produce integrated circuits from this schematic without any more instructions than those contained therein. (Note that the notation 10/200 for N3 means a gate width of 10 μm and length of 200 μm and similarly for the other MOSFETs.) It is similar to the typical embodiment discussed above with a few differences. First, it uses P-wells instead of N-wells. This means that all polarities are reversed, i.e., all supply voltages are negative and, in some cases, N channel and P channel MOSFETS are interchanged. Thus, Q1 becomes P1, Q2 becomes P2, but Q3 becomes N3. S1 is shown as N1. Also, an additional MOSFET N2 was provided in case it was useful to subtract a fixed current from $I_{det}$ in addition to $I_{Q3}$. However, in practice this proved unnecessary.

The circuit was constructed using a very conservative 0.6 μm feature size process but, even so, the chip measured a relatively small 0.026 sq. in., less than about three instrumentation op amps in area. The circuit was run with chopping frequencies from 200 to 500 Hz and with photodetector quiescent currents ranging from 50 na to 5 μA. Over these ranges the processed $V_{out}$ was substantially linear with optical signal and followed the frequency response of the linear model. Channel to channel variations in gain and frequency response were about 5%. The noise was equivalent to the noise from a 10 MΩ lead sulphide detector when it was operated with a 2.5 μa quiescent current. For many commercial applications this performance is adequate.

If the economics permits a larger chip, better performance could be achieved with the following improvements. The 0.1 pf. value for C2 is so small that nearby parasitic capacitances cause its value to increase from the nominal by varying amounts. A larger value and/or MOSFET isolation would help. However, this requires a larger C3 which at 30 pf takes up about 10% of the existing chip area. If larger chips were affordable, a larger C3 would reduce the kT/C current noise that feeds Q3 in proportion to the square root of the increase in area and a larger ratio of C3/C2 would provide more stability at low frequencies. Lastly, a longer Q3 gate would reduce its $G_m$ and therefore its noise. Alternatively, an IC process using a thicker gate oxide (a drawback in most applications) would also reduce $G_m$.

5. Other Applications

Those skilled in the art will appreciate that many tradeoffs are made in designing systems where this invention could be used. Consideration must be given to the signal characteristics, modulators available, background and detector characteristics. However, using the teachings herein it should be obvious how to modify the invention to handle a wide variety of applications.

For example, the invention is not limited to photoconductor applications. Since these have been made into and modeled as current sources, all other classes of detectors that require quiescent current suppression may benefit. As an example, InSb and InAs photovoltaic detectors have rather large quiescent currents, especially if they are reversed biased to reduce capacitance. Even silicon photodiodes have large quiescent currents if they are hot or reverse biased and have a large area. At low frequencies, even detectors with small quiescent currents could benefit.

What is claimed is:

1. In an integrating capacitor type amplifier having an integration capacitor and a reset switch for periodically, after an integration period during which the capacitor is charging to a voltage, discharging the integration capacitor and having discharged the capacitor allowing it to recharge during a succeeding integration period,
   the amplifier for use with a photodetector having a photodetector current comprised of quiescent currents and signal currents generated by sometimes incident optical signals and having the photodetector current charging the integration capacitor to a voltage which is further processed by connected circuitry which saturates when the voltage on the integration capacitor is too high,
   a method of compensating for the current from the quiescent photodetector comprising the steps of:
   a) obtaining a sample of the voltage on the integration capacitor at controlled sample times during one or more integration times;
   b) obtaining an average of one or more of the voltage samples; and
   c) subtracting current from the photodetector current that is charging the integration capacitor in a monotonicaly increasing amount as the average increases;
   whereby a feedback loop is formed external to the integrating capacitor type amplifier and the voltage on the integration capacitor for the integration periods at corresponding sample times is kept constant at a desired value.

2. The method of claim 1 wherein samples are obtained only from integration periods when it is known that no optical signal is present so that the constant desired value of voltage on the integration capacitor is determined only by quiescent currents.

3. The method of claim 2 wherein the timing of samples is adjusted over a range from the beginning to the end of the integration period so that the voltage at the end of the integration period is controlled so that the range of signal currents when present which will produce a voltage on the integration capacitor at the end of an integration period which is between zero and the saturation voltage is adjusted to be in a range from the most negative value of opposite polarity to the quiescent current to the most positive value of the same polarity, respectively.

4. The method of claim 1 wherein an approximately equal number of samples are obtained from integration periods when it is known that no optical signal is present and when it is known that optical signals are present so that the constant desired value of voltage on the integration capacitor is determined by an average of quiescent currents and signal currents.

5. The method of claim 4 wherein the timing of samples is adjusted over a range from the beginning to the end of the integration period so that the voltage on the integration capacitor at the end of the integration period produced by the average value of the quiescent and signal currents can be adjusted, preferably to a value of half the saturation voltage.

6. The method of claim 1 wherein the number of samples is increased from less than one per integration period to more than one per integration period until a desired feedback loop phase margin is achieved.

7. In an integrating capacitor type amplifier having an integration capacitor and a controllable reset switch for periodically, after an integration period during which the capacitor is charging to a voltage, discharging the integration capacitor and having discharged the capacitor allowing it to recharge during a succeeding integration period,
   the amplifier for use with a photodetector having a photodetector current comprised of a quiescent current and signal currents generated by sometimes incident optical signals and having the photodetector current charging the integration capacitor to a voltage which is further processed by connected circuitry which saturates when the voltage on the integration capacitor is too high,
   an apparatus for compensation of the quiescent current from the photodetector comprising:
   a) a sampler in electrical communication with the integration capacitor for obtaining a sample of the voltage on the integration capacitor at controlled sample times during one or more integration periods and having a sampler control signal connection;
   b) an averager in electrical communication with the sampler for obtaining an average of one or more of the voltage samples and having an averager control signal connection;
   c) timing circuitry in electrical communication with the controls of the reset switch, averager, and sampler and capable of generating separate control signals for each; and
   d) a controlled current source having a control port in electrical communication with the averager output and having an output port in electrical communication with the integrating capacitor type amplifier for subtracting current from the photodetector current that is charging the integration capacitor in a monotonically increasing amount as the average increases;

whereby a feedback loop is formed external to the integrating capacitor type amplifier and the voltage on the integration capacitor for the integration periods at corresponding sample times is kept constant at a desired value.

8. The apparatus of claim 7 wherein the timing circuitry causes the sampler to obtain samples of the voltage on the integration capacitor at controlled times during integration periods when it is known that no optical signals are present so that the constant desired value of voltage on the integration capacitor is determined only by quiescent currents.

9. The apparatus of claim 8 wherein the timing circuitry causes the samples of the voltage on the integration capacitor to be obtained over a range from the beginning to the end of the integration period so that the range of signal currents when present which will produce a voltage on the integration capacitor at the end of an integration period which is between zero and the saturation voltage is adjusted to be in a range from the most negative value of opposite polarity to the quiescent current to the most positive value of the same polarity, respectively.

10. The apparatus of claim 7 wherein the timing circuitry causes an approximately equal number of samples to be obtained from integration periods when it is known that no optical signal is present and when it is known that optical signals are present so that the constant desired value of voltage on the integration capacitor is determined by an average of quiescent currents and signal currents.

11. The apparatus of claim 10 wherein the timing circuitry causes samples to be obtained over a range from the beginning to the end of the integration period so that the voltage on the integration capacitor at the end of the integration period produced by the average value of the quiescent and signal currents can be adjusted, preferably to a value of half the saturation voltage.

12. The apparatus of claim 7 wherein the timing circuitry causes the number of samples to be increased from less than one per integration period to more than one per integration period until a desired feedback loop phase margin is achieved.

13. The apparatus of claim 7 wherein:
a) the sampler comprises a transistor single pole on/off switch with one side in electrical communication with the integration capacitor and a sampling capacitor in electrical communication with the other side of the switch;
b) the averager comprises a transistor single pole on/off switch with one side in electrical communication with the sampling capacitor and an averaging capacitor in electrical communication with the other side of the switch; and
c) the controlled current source comprises a transistor current source having a control port in electrical communication with the averaging capacitor, an input port in electrical communication with a voltage power supply, and a current source output port in electrical communication with the integration capacitor, whereby a feedback loop is formed external to the integrating capacitor type amplifier and the voltage on the integration capacitor for the integration periods at corresponding sample times is kept constant at a desired value.

14. The apparatus of claim 13 wherein the ratio of averaging capacitor value to sampling capacitor value is selected to provide a stable feedback loop at low frequencies.

15. The apparatus of claim 13 wherein the transistors are MOSFETs.

16. The apparatus of claim 13 wherein the controlled current source is a MOSFET selected to have as low a transconductance as possible but no lower than the quotient of the maximum current expected from the photodetector and the maximum value of the voltage on the integration capacitor before the connected circuitry saturates, whereby the noise due to the controlled current source is minimized and the average value on the integration capacitor can be controlled to be no larger than the circuit saturation voltage.

17. An integrated circuit for amplifying signals from one or more photodetectors having an integrating capacitor type amplifier in electrical communication with each photodetector, the amplifier comprising an integration capacitor and a reset switch with an externally connected control port for periodically, after an integration time during which the integration capacitor is charged to a voltage by current from the photodetector, discharging the integration capacitor and having discharged the capacitor allowing it to recharge during a succeeding integration period, the improvement comprising:
a) providing a sampling switch to momentarily place the integration capacitor in electrical communication with a sampling capacitor and having a control port for electrical communications external to the integrated circuit;
b) providing an averager switch to momentarily place the sampling capacitor in electrical communication with an averaging capacitor and having a control port for electrical communications external to the integrated circuit; and
c) providing a transistor current source having a control port in electrical communication with the averaging capacitor, an input port in electrical communication with a voltage supply, and a current source output port in electrical communication with the integration capacitor, whereby external timing circuitry can be used to control the reset switch, sampling switch, and averager switch thereby forming a feedback loop external to the integrating capacitor type amplifier so that the voltage on the integration capacitor at determinable times within the integration periods can be kept constant at a desired value.

18. The integrated circuit defined in claim 17 wherein the ratio of the values of the averaging to sampling capacitors is selected to provide a stable feedback loop stability at low frequencies.

19. The integrated circuit of 17 wherein the controlled current source is a MOSFET selected to have as low a transconductance as possible but no lower than the quotient of the maximum current expected from the photodetector and the maximum value of the voltage on the integration capacitor before the connected circuitry saturates, whereby the noise due to the controlled current source is minimized and the average value on the integration capacitor can be controlled to be no larger than the circuit saturation voltage.

* * * * *